United States Patent [19]

Kinoshita et al.

[11] Patent Number: 5,321,716
[45] Date of Patent: Jun. 14, 1994

[54] DISTRIBUTED FEEDBACK SEMICONDUCTOR LASER WITH CONTROLLED PHASE SHIFT

[75] Inventors: Junichi Kinoshita; Kazuaki Otsuka, both of Yokohama, Japan

[73] Assignee: Kabushiki Kaisha Toshiba, Kawasaki, Japan

[21] Appl. No.: 991,276

[22] Filed: Dec. 16, 1992

[30] Foreign Application Priority Data

Dec. 17, 1991 [JP] Japan ................. 3-333572

[51] Int. Cl.$^5$ ................................ H01S 3/08
[52] U.S. Cl. ........................ 372/96; 372/46; 372/45; 372/87
[58] Field of Search ............ 372/96, 46, 45, 87

[56] References Cited

U.S. PATENT DOCUMENTS 4,802,187 1/1989 Bouley et al. ............... 372/96

FOREIGN PATENT DOCUMENTS

| | | | |
|---|---|---|---|
| 0171190 | 8/1986 | Japan | 372/96 |
| 0202487 | 9/1986 | Japan | 372/96 |
| 0069983 | 3/1990 | Japan | 372/46 |

OTHER PUBLICATIONS

Shirasaki et al., 311, 1-126, (1985) National Conference at the Electrocommunications Society (Semiconductor & Materials Division).

Usami et al., C-155, C-1-37 (1988) Autumn National Conference of the Electronic Information Communication Society.

*Primary Examiner*—Georgia Y. Epps
*Attorney, Agent, or Firm*—Finnegan, Henderson, Farabow, Garrett & Dunner

[57] ABSTRACT

A distributed feedback semiconductor laser comprises a semiconductor substrate, a waveguiding structure, provided on the semiconductor substrate, including a diffraction grating, an active layer and a top layer for ohmic contact, a first electrode provided on the top layer, a second electrode attached to the semiconductor substrate, and means for compensating spatial nonuniformity of a carrier density caused by spatial hole burning. The means changes an electrical resistance between the first electrode and the active layer, corresponding to a spatial distribution of photon density along the waveguiding structure.

10 Claims, 6 Drawing Sheets

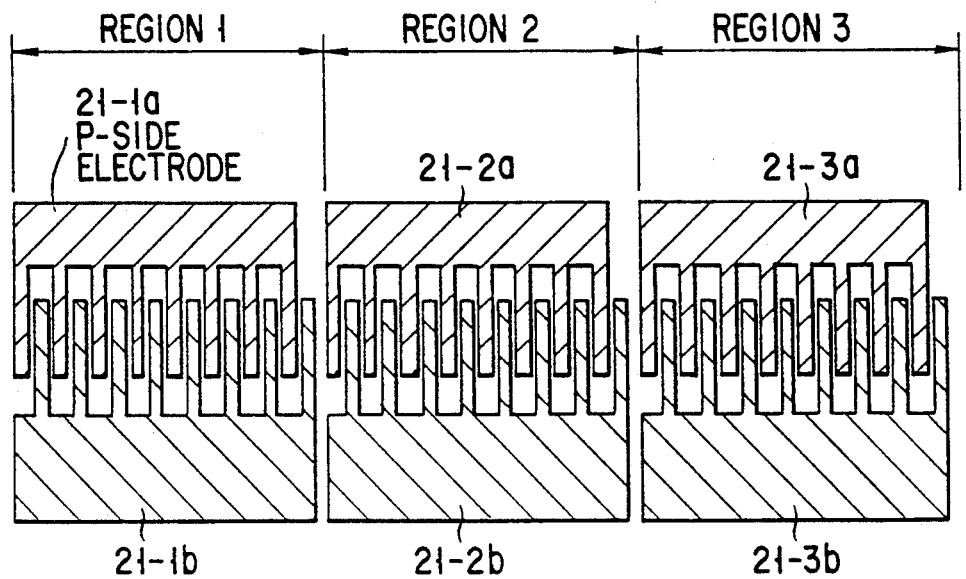
F I G. 5A
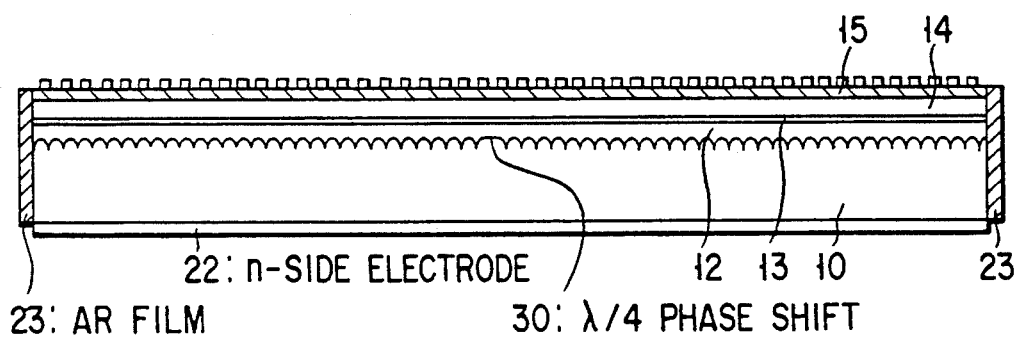
F I G. 5B

DISTRIBUTED FEEDBACK SEMICONDUCTOR LASER WITH CONTROLLED PHASE SHIFT

BACKGROUND OF THE INVENTION

1. Field of the Invention

The present invention relates to a single longitudinal mode distributed feedback semiconductor laser and, more particularly, to a distributed feedback semiconductor laser for performing optical feedback by a diffraction grating formed along an optical waveguide.

2. Description of the Related Art

In recent years, a DFB (Distributed Feedback) semiconductor laser has been used as a light source for an optical communication system. This laser includes the diffraction grating along the optical waveguide to realize the single longitudinal operation by the wavelength selectivity. More specifically, the DFB laser using a GaInAsP/InP material is practically used as the light source of long-distance, high-speed optical communication.

In general, a semiconductor laser, e.g., a Fabry-Perot laser, has both facets used as reflection mirrors to provide the optical feedback. In contrast, the DFB laser includes the diffraction grating having the wavelength selectivity to perform the optical feedback. Therefore, the DFB laser may not basically require the optical reflection between the facets. However, in the DFB laser, the single longitudinal mode oscillation depends on the depth and configuration of the diffraction grating, the magnitude of the reflection at the facets, and the phase of the diffraction grating. Therefore, the single longitudinal mode oscillation is not necessarily obtained.

A phase shift DFB laser has been also proposed. The phase shift DFB laser has a structure in which the reflectivity of the cleaved facets is decreased, and the central portion of the cavity has a discontinuous (phase shift) portion (shifted by a phase corresponding to ¼ the waveguide wavelength $\lambda$) of the period of the diffraction grating. Since the laser having the $\lambda/4$ shift structure has a large oscillation threshold gain difference in the longitudinal mode, it is very advantageous in the single mode operation.

The diffraction grating having the phase shift is usually formed by a two-beam interferometric exposure technique using positive and negative resist materials (e.g., Utaka et al, 29p-ZB-15, Extended Abstract, The 32nd Spring Meeting 1985, The Japan Society of Applied Physics), and the two-beam interferometric exposure technique using a phase mask (e.g., Shirasaki et al, 311 National Conference Record 1984, Semiconductor Devices and Materials, The Institute of Electronics Information and Communication Engineers (IEICE) of Japan) and (e.g., Shirasaki et al, Research Report, OQE85-60, The Institute of Electronics, Information and Communication Engineers (IEICE) of Japan), or the like. In these techniques, it is difficult to optimize reproducibly a kind of resist materials, exposure conditions, design of phase masks, and reduction of unwanted reflection. Therefore, it is difficult to provide the diffraction grating having the phase shift region.

A phase shift DFB laser having a GaInAsP/InP buried heterostructure will be described below with reference to FIGS. 7A and 7B. A first-order diffraction grating 51 is formed on an n-type InP substrate 50, using the two-beam interferometric exposure technique. A $\lambda/4$ phase shift 52 is then provided in the diffraction grating 51. An n-type GaInAsP waveguide layer 53 ($\lambda = 1.3$ $\mu$m band composition), an undoped GaInAsP active layer 54 ($\lambda = 1.55$ $\mu$m band composition), a p-type InP cladding layer 55 and a $p^+$-type GaInAsP ohmic contact layer 56 ($\lambda = 1.15$ $\mu$m band composition) are sequentially grown on the diffraction grating 51, and these layers are mesa-etched in the form of a stripe. Thereafter, a p-type InP buried layer 57, an n-type InP buried layer 58, and an undoped GaInAsP cap layer 59 ($\lambda = 1.15$ $\mu$m band composition) are successively grown on either side of the mesa-stripe to complete the buried structure. A p-type electrode is provided on the top of the structure, and an n-type electrode is formed on the bottom of the structure. At this time, since a current is blocked by a reverse-biased pn junction in the buried regions, the carriers are effectively injected in only the GaInAsP active layer 54. In addition, the reflectivity of the cleaved facets of the structure is decreased by AR (Anti-Reflection) coating 62.

Since the reflection at the facets is greatly lowered in the phase shift DFB laser, the phase of the facets is not almost affected, and single longitudinal mode oscillation is easily obtained. However, the phase shift DFB laser has the following drawbacks.

(1) It is difficult to provide the actual phase shift.

(2) Although the phase shift must be approximately located at the center of the cavity, the position of the phase shift cannot be visually observed after the crystal growth.

In order to eliminate the above drawbacks, there has been proposed a method of forming an equivalent phase shift. According to the method, an equivalent phase shift region having different dimensions such as the width and thickness of the waveguide layer from the peripheral portion is provided instead of forming the actual phase shift in the diffraction grating. Since the equivalent refractive index of the equivalent phase shift region is different from that of the peripheral portion, the phase of the propagating light relative to the grating is changed after passing through the phase shift region. This means that the phase shift is equivalently provided in the diffraction grating. Therefore, the fabrication process requires only the uniformly formed grating without any of actual phase shifts.

A conventional equivalent phase shift DFB laser will be described below with reference to FIG. 8. This laser has an equivalent phase shift region 63 obtained by decreasing the width of the GaInAsP active layer 54 in the central region of the cavity. A stripe pattern mask having a narrow stripe width in the central region of the resonator is formed, and the resultant structure is mesa-etched, thereby easily obtaining the stripe. Particularly such a manufacturing process is not required for a specific process for making the phase shift structure, and the equivalent phase shift structure has characteristics equal to or better than those of a simple phase shift structure (e.g., Matsuyama et al, 30a-SA-17, Extended Abstract, The Spring Meeting 1990, The Japan Society of Applied Physics).

However, in the equivalent phase shift DFB laser, when the thicknesses of the n-type GaInAsP waveguide layer 53 and the undoped GaInAsP active layer 54 vary in every wafers, the variation in the equivalent refractive index may occur. As a result, the length of the equivalent phase shift region 63 for realizing a desired amount of phase shift is changed. Therefore, the amount of the phase shift is varied. In addition, several kinds of masks having different lengths of the phase shift regions are required corresponding to the change in thickness of these layers.

Since a hole burning phenomenon along the cavity direction occurs in the phase shift DFB laser, the single longitudinal mode property is often impaired after the laser oscillation (e.g., Soda et al, Research Report, OQE87-7, The Institute of Electronics, Information and Communication Engineers (IEICE) of Japan). That is, when the value of a normalized coupling coefficient κL (L: cavity length) is larger than 1.25, guided light is concentrated at the position of the λ/4 phase shift 52 (solid line) as shown in FIG. 9A. Such a large deviation in the optical intensity distribution along the cavity direction changes the distribution of the relative carrier density in the GaInAsP active layer 54 (broken line). In addition, the refractive index of the waveguide is changed corresponding to the distribution. Due to the change in the waveguide structure, a large gain difference between longitudinal modes is decreased. That is, the single longitudinal mode property is greatly impaired.

As shown in FIG. 9B, the value of κL is smaller than 1.25, the relative density of guided light is decreased at the central portion of the cavity (solid line). For this reason, the relative carrier density is increased at the central portion (broken line). Therefore, the refractive index at the central portion is decreased. In this case, since the optimal value (λ/4) of the phase shift is canceled, the gain difference is decreased. As a result, the single longitudinal mode property is remarkably impaired.

The effect of the hole burning phenomenon to laser characteristics will be described below. After oscillation is performed, a so-called superlinear curve in which slope efficiency is continuously increased is drawn. Since such a superlinear behavior gives a serious distortion to an output signal, the laser cannot be applied to analog communication systems. A laser having a good linear I-L (current-light output) characteristic is desired. Further, after such a strong nonlinearity, a kink, i.e., a discontinuity in the I-L curve often occurs, resulted in a mode-jump.

Since the equivalent phase shift DFB laser with the narrow width has the reduced optical confinement effect in the equivalent phase shift region to render the relatively small change in the equivalent refractive index, it is not almost affected by hole burning (e.g., Nakano et al, 6p-ZC-7, Extended Abstract, The 49th Autumn Meeting 1988, No. 3, The Japan Society of Applied Physics). However, this effect is not satisfactory.

For compensating the hole burning in the axial direction, a nonuniformed current injection technique has been proposed (e.g., Usami et al, C155, 1988, Autumn National Convention Record, The Institute of Electronics Information and Communication Engineers (IECIE) of Japan). According to the technique, an electrode of the laser is axially divided into a plurality of electrodes which are capable of injecting the current into the active layer separately. The current increasingly injected into the active region having a lower carrier density compensates the nonuniformity to suppress the nonlinearity and the resultant mode jump (caused by the hole burning). However, it is necessary to employ variable resistors corresponding to the number of the divided electrodes. A control system including the adjustment of the variable resistors is complicated, and the cost of the module is increased.

As described above, in the phase shift DFB laser, it is difficult to form the phase shift, and the position of the phase shift cannot be visually observed whether it is located at the cavity center or not. Further, although there is provided the method of forming the equivalent phase shift, it requires several kinds of masks having different phase shift lengths corresponding to change in thickness of the active layer and the waveguide layer. Therefore, such a method takes much time.

In addition, the hole burning phenomenon axially occurs in the phase shift DFB laser, and the single longitudinal mode property is often impaired after oscillation. In the equivalent phase shift DFB laser having the narrow width, the effect of hole burning cannot be sufficiently eliminated. For this reason, the nonuniformed current injection technique is used to compensate the hole burning. However, in order to supply the current to separated electrodes, variable resistors having the same number as that of the divided electrodes are required to complicate the control system.

SUMMARY OF THE INVENTION

It is, therefore, an object of the present invention to provide a distributed feedback semiconductor laser capable of controlling an amount of phase shift.

It is another object of the present invention to provide a distributed feedback semiconductor laser capable of controlling an amount of carrier injection into an active layer.

It is still another object of the present invention to provide a distributed feedback semiconductor laser which is not almost affected by hole burning in a direction of cavity axis.

It is still another object of the present invention to provide a distributed feedback semiconductor laser in which a resistance between an electrode and an active layer is changed to compensate a relative change in carrier density caused by hole burning.

According to one aspect of the present invention, there is provided a distributed feedback semiconductor laser, which comprises a semiconductor substrate, a waveguiding structure, provided on the semiconductor substrate, including a diffraction grating, an active layer and a top layer for ohmic contact, a first electrode provided on the top layer, a second electrode attached to the semiconductor substrate, and means for compensating spatial nonuniformity of a carrier density caused by spatial hole burning. The means changes an electrical resistance between the first electrode and the active layer, corresponding to a spatial distribution of photon density along the waveguiding structure.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 5A is a plan view schematically showing a p-side electrode of a phase shift DFB semiconductor laser according to a fourth embodiment of the present invention;

FIG. 5B is a sectional view showing the phase shift DFB semiconductor laser of FIG. 5A in a direction of a cavity axis;

DETAILED DESCRIPTION OF THE PREFERRED EMBODIMENTS

Embodiments of the present invention will be described below with reference the accompanying drawings.

In a first embodiment of the present invention, a thickness of an ohmic contact layer is changed at a phase shift region and the other region when a semiconductor body is mesa-etched to provide a stripe-shaped DFB laser, thereby controlling a width of a waveguide layer and an active layer after mesa etching.

Figure 1:
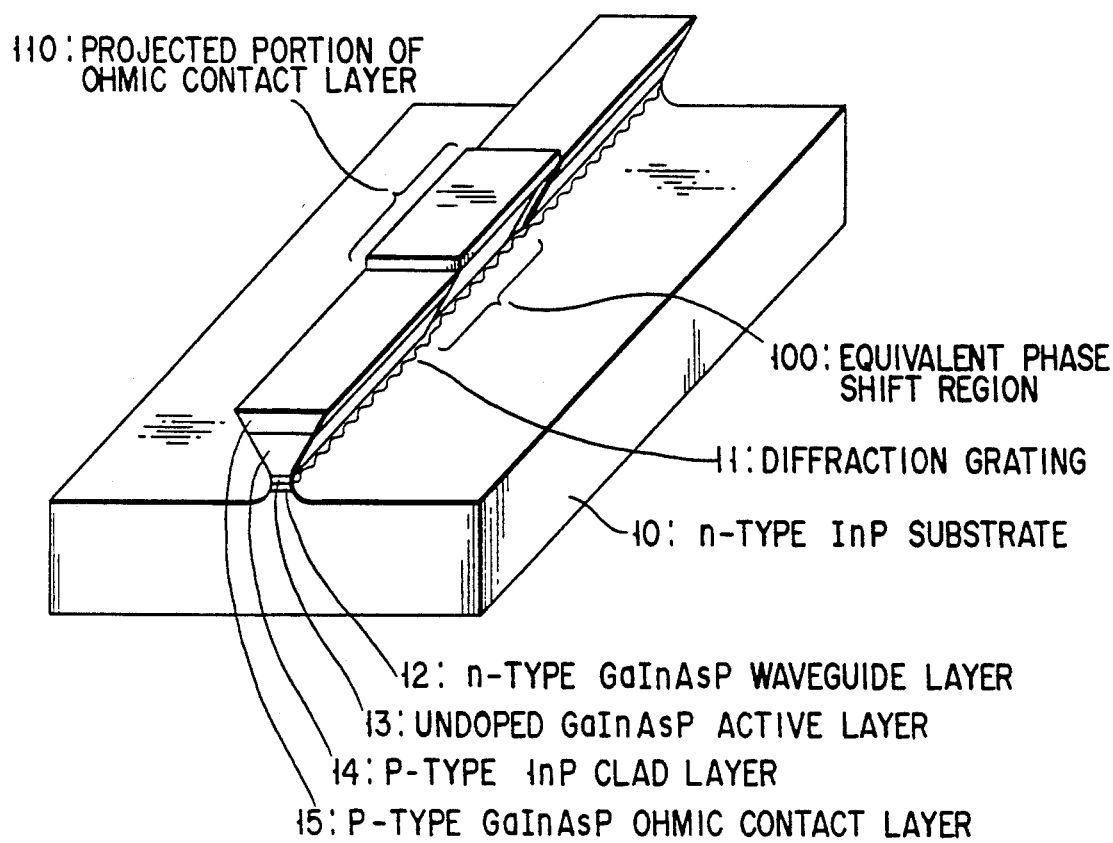
FIG. 1 is a perspective view schematically showing a mesa stripe structure of an equivalent phase shift DFB semiconductor laser according to a first embodiment of the present invention.

FIG. 1 is a perspective view showing a semiconductor laser according to the present invention that includes an equivalent phase shift region 100 having a narrow active layer stripe at a cavity center.

As is apparent from FIG. 1, the semiconductor laser includes a diffraction grating 11 formed on an n-type InP substrate 10. An n-type GaInAsP waveguide layer 12, an undoped GaInAsP active layer 13, a p-type clad layer 14 and a p+-type GaInAsP ohmic contact layer 15 are sequentially provided on the diffraction grating 11. A projected portion 110 of the ohmic contact layer 15 provided above the equivalent phase shift region 100 is thicker than the other portion.

The step heights of the ohmic contact layer can be easily formed by selectively etching the p+-type GaInAsP ohmic contact layer 15 through a proper mask before mesa-etching the semiconductor body. The dimension of the step heights is controlled by the etching time.

Figure 2A:
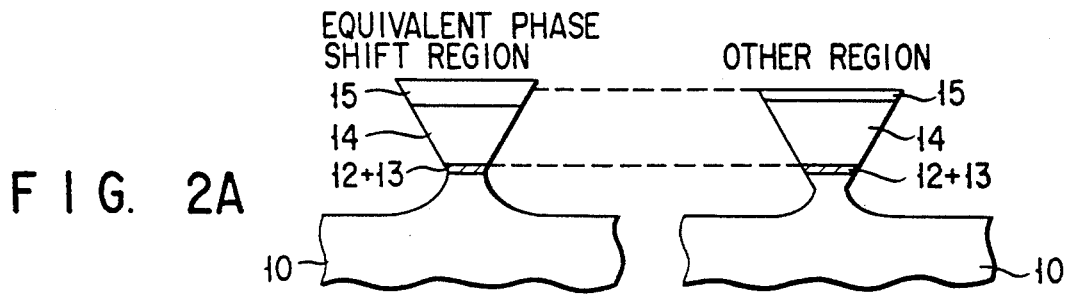
FIGS. 2A and 2B are sectional views showing an equivalent phase shift region and another regions in FIG. 1, respectively.

When the p+-type GaInAsP ohmic contact layer 15 having the projected portion 110 is covered with a stripe-shaped mask to carry out the mesa-etching, the etching proceeds along a (111) A plane so as to provide an inverse triangle section. Therefore, when the side surfaces of the GaInAsP active layer 13 are mesa-etched to form the (111) A plane, a total width of the n-type GaInAsP waveguide layer 12 and the GaInAsP active layer 13 becomes narrower in the equivalent phase shift region 100 having the thick ohmic contact layer than in other regions as shown in FIG. 2A. That is, the difference between the total width of the n-type GaInAsP waveguide layer 12 and the GaInAsP active layer 13 in the equivalent phase shift region 100 and the total width of the n-type GaInAsP waveguide layer 12 and the GaInAsP active layer 13 in other regions is determined by the dimension of the step heights between the projected portion 110 and the p+-type GaInAsP ohmic contact layer 15.

Therefore, the dimension of the step heights of the ohmic contact layer is controlled in accordance with the thickness of the active layer and the like (therefore, the width of these layers are controlled), and an amount of equivalent phase shift can be controlled. For this reason, it is not necessary to change kinds of stripe masks and the length of the equivalent phase shift region 100.

In this case, the GaInAsP active layer 13 is narrow in the equivalent phase shift region 100, and a distance between the GaInAsP active layer 13 and an electrode (not shown) provided on the ohmic contact layer 15 is large, thereby increasing the resistance therebetween. Therefore, an amount of current injection into the equivalent phase shift region 100 after oscillation is relatively decreased. When the value of κL (normalized coupling coefficient) is smaller than 1.25, and the relative optical intensity of the phase shift region is low, hole burning can be effectively suppressed.

In contrast, when the ohmic contact layer in the equivalent phase shift region 100 is recessed, the resistance is reduced because the GaInAsP active layer 13 is wide, and the distance between the GaInAsP active layer 13 and the electrode is short. Therefore, the amount of current injection into the phase shift region is increased after oscillation. For this reason, when the value of κL is larger than 1.25 and the carrier density of the phase shift portion is relatively decreased, the hole burning is effectively suppressed. However, since the GaInAsP active layer 13 becomes wide, the coefficient of optical confinement is increased to increase the change in the refractive index. A balance between the increase in width of the GaInAsP active layer 13 and the change in refractive index is an important factor for suppressing the hole burning.

Figure 2B:
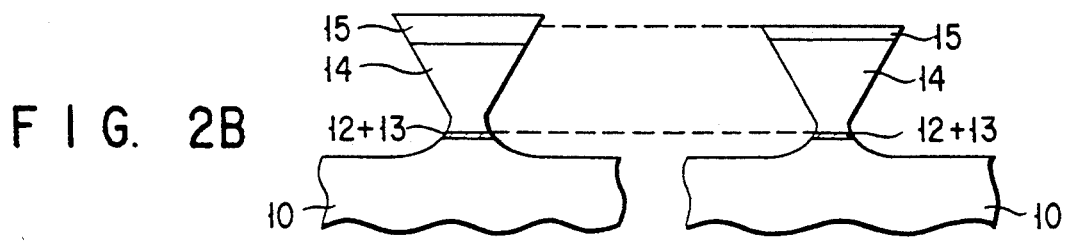

In the first embodiment, the active layer is located at the constricted portion of the mesa structure having the (111) A plane. On the contrary, when the active layer are located at a divergent portion of the mesa structure as shown in FIG. 2B, the equivalent phase shift region becomes wider than the active layer or the like.

According to the first embodiment, since the thickness of the ohmic contact layer in the phase shift region is different from that in the other region, the waveguide layer and the active layer have the different widths for the phase shift region and the other region. Therefore, the equivalent refractive index is changed, and the phase shift region is equivalently provided.

Since the amount of current injection into the active layer is changed, depending upon the distance between the electrode and the active layer, the nonuniformity of the carrier density caused by hole burning can be compensated. In addition, the equivalent phase shift DFB laser can be easily provided without preparing the phase shift masks adapted to variations in the thicknesses of the active layer and the waveguide layer as in the prior art.

A second embodiment is an example for decreasing the resistance between the electrode and the active layer in the phase shift region. After buried layers are provided in the DFB laser, the ohmic contact layer in the phase shift region is etched such that the distance between the electrode and the active layer is decreased.

Figure 3:
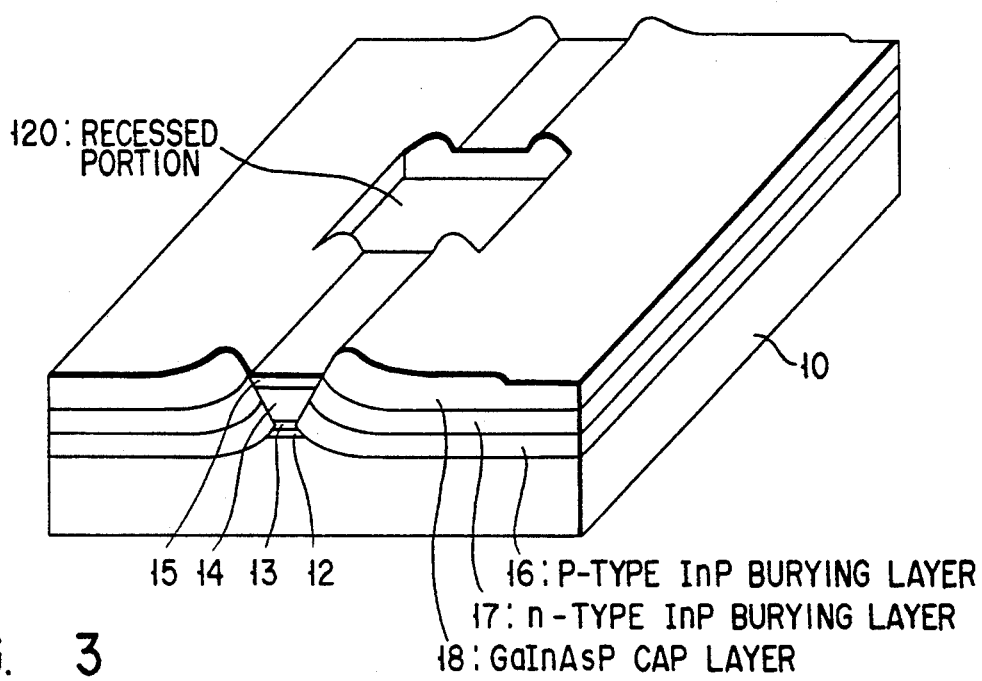
FIG. 3 is a perspective view schematically showing an equivalent phase shift DFB semiconductor laser according to a second embodiment of the present invention.

As shown in FIG. 3, after the semiconductor body is mesa-etched in the form of the mesa-stripe, a p-type InP buried layer 16, an n-type InP buried layer 17, and a GaInAsP cap layer 18 are sequentially grown at both sides of the stripe structure. Thereafter, the $p^+$-type GaInAsP ohmic contact layer 1 located at the central portion of the cavity region having the phase shift is etched to form a recessed region 120. For this reason, the resistance of the phase shift region is lower than that of the peripheral portion. Therefore, since the current is injected into the active layer to compensate the nonuniformity of the carrier density, hole burning can be suppressed, and the optical output-current characteristic having the single longitudinal mode and good linearity can be obtained up to several tens mW.

According to the second embodiment, the distance between the electrode and the active layer is decreased by forming the recessed portion in the ohmic contact layer of the phase shift region. In addition, since the impurity concentration of the phase shift region is increased, the resistance between the electrode and the active layer can be decreased. Since the potential of the active layer is kept constant after oscillation, the amount of current injection into the active layer is changed by the resistance between the electrode and the active layer. Therefore, the amount of carrier injection into a portion having the low resistance is increased, and the nonuniformity of the carrier density along the axial direction caused by hole burning can be compensated.

In a third embodiment, an impurity concentration is partially increased by diffusing or implanting an impurity into the phase shift region to reduce the resistance between the electrode and the active layer in the phase shift region as in the second embodiment.

Figure 4A:
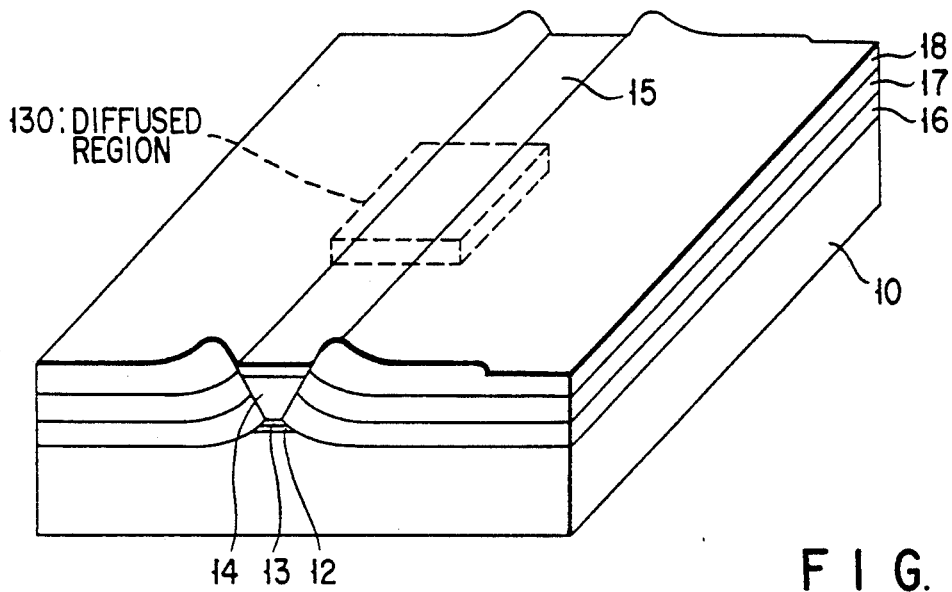
FIGS. 4A to 4C are a perspective view and a partial sectional view, respectively, schematically showing a phase shift DFB semiconductor laser according to a third embodiment of the present invention.
Figures 4B, 4C:
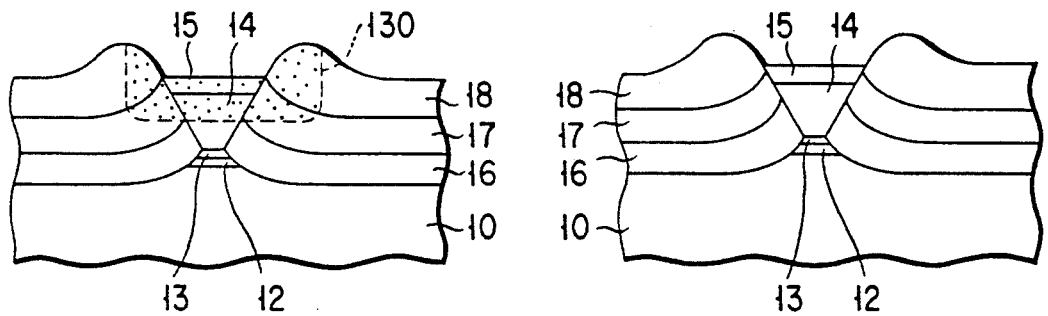

As shown in FIGS. 4A and 4B, in a phase shift DFB laser having the GaInAsP cap layer 18, an impurity, e.g., zinc is selectively diffused into the central region of the cavity having the phase shift to form a zinc diffusion layer 130. FIGS. 4B and 4C are sectional views showing the central and end portions of the cavity having the zinc diffusion layer 130, respectively.

The diffusion region highly doped with zinc has the low resistance. In the embodiment, since zinc is widely diffused into the central region of the cavity, the resistance is greatly reduced. For example, the diffused portion has a half or less resistance as compared to that of the non-diffused portion (the resistance is about 4Ω when the cavity length is given by 300 μm). Therefore, since the current is injected into the central portion of the cavity having the decreased carrier density so as to compensate the carrier density, hole burning is suppressed, so that the optical output-current characteristic having good linearity at the single longitudinal mode operation can be obtained up to 100 mW.

The value of $\kappa L$ of the laser is 2.5. In the prior art laser having no diffused region and the $\kappa L$ value of 2.5, the optical output-current characteristic tends to be saturated at 20 mW or less, and the mode jump occur to become the two-mode operation. However, as described in the second and third embodiments, the I-L characteristic can be remarkably improved by reducing the resistance of the phase shift region.

A fourth embodiment shows a DFB laser which includes on one surface an injection electrode having an interdigital electrode structure. The interdigital electrode structure includes pairs of comb-shaped electrodes each having digital stripes. The resistance between the electrode structure and the active layer can be equivalently changed by selecting at least one of pairs of comb-shaped electrodes.

In other words, one electrode for injecting the current into the active layer is axially divided into a plurality of separated electrodes, each of which is further divided into a plurality of separated electrodes so as to provide an interdigital electrode structure.

FIG. 5A is a plan view showing a structure of a p-side electrode in the phase shift DFB laser having the GaInAsP/InP buried structure, and FIG. 5B is a sectional view showing the structure of the p-side electrode along the cavity axis. The p-side electrode is divided into three electrode regions along the cavity axis (electrode regions 1, 2, and 3). Each of the electrode regions includes the interdigital electrode structure having pairs of comb-shaped electrodes (21-1a and 21-1b), (21-2a and 21-2b) and (21-3a and 21-3b) each having digital stripes. In this case, each pair of comb-shaped electrodes is arranged such that the cavity axis passes approximately through the center of the interdigitated portion of the digital stripes. For example, the electrode region 1 is provided by the pair of comb-shaped electrodes 21-1a and 21-1b, and the digital stripes of the comb-shaped electrode 21-1a are interdigitated with these of the comb-shaped electrode 21-1b.

Each of the comb-shaped electrodes is provided such that the equivalent resistance is higher than that of the overall electrode without the interdigital structure when the current flows through GaInAsP active layer 13. That is, although the current widely spreads near the GaInAsP active layer 13, it narrowly flows therethrough just under the digital stripes, depending on the width of the digital stripes. In contrast, when the pair of comb-shaped electrodes is used, they represent a resistance value which corresponds to approximate one in the case where the overall electrode is employed.

When the value $\kappa L$ is larger than 1.25, the waveguide light is concentrated to the λ/4 phase shift position 30 to reduce the carrier density. In this case, wire bonding is performed such that the current flows through only the four comb-shaped electrodes except for the comb-shaped electrodes 21-1a and 21-3a. Therefore, when the laser operates, only one of the pair of comb-shaped electrodes is used in each of the electrode regions 1 and 3, i.e., only the comb-shaped electrodes 21-1b and 21-3b are employed, thereby increasing the resistance in the electrode regions 1 and 3, respectively. On the other hand, since the pair of comb-shaped electrodes 21-2a and 21-2b function in the electrode region 2, the resistance is low. Therefore, a large current flows through the central portion of the cavity in which the carrier density is relatively decreased by hole burning. In this manner, the decrease in relative carrier density caused by hole burning can be compensated.

Figure 6:
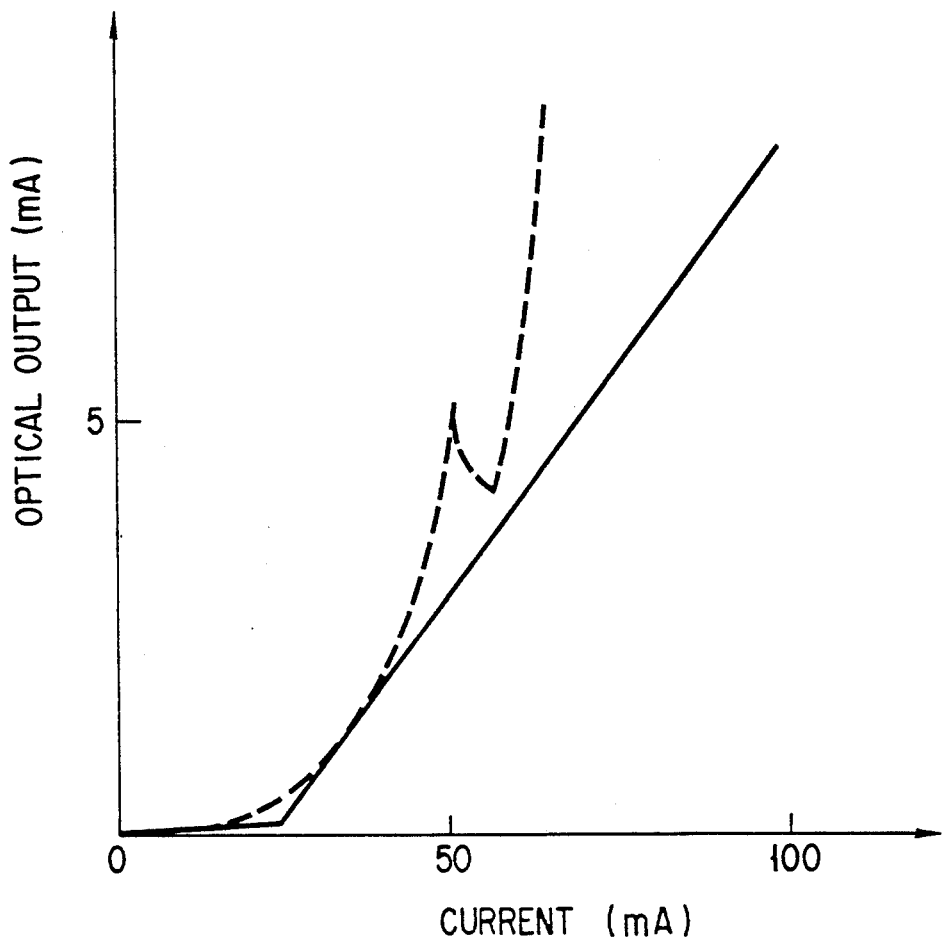
FIG. 6 is a graph showing current-optical output (I-L) characteristics of the semiconductor laser in the fourth embodiment.
Figure 7A:
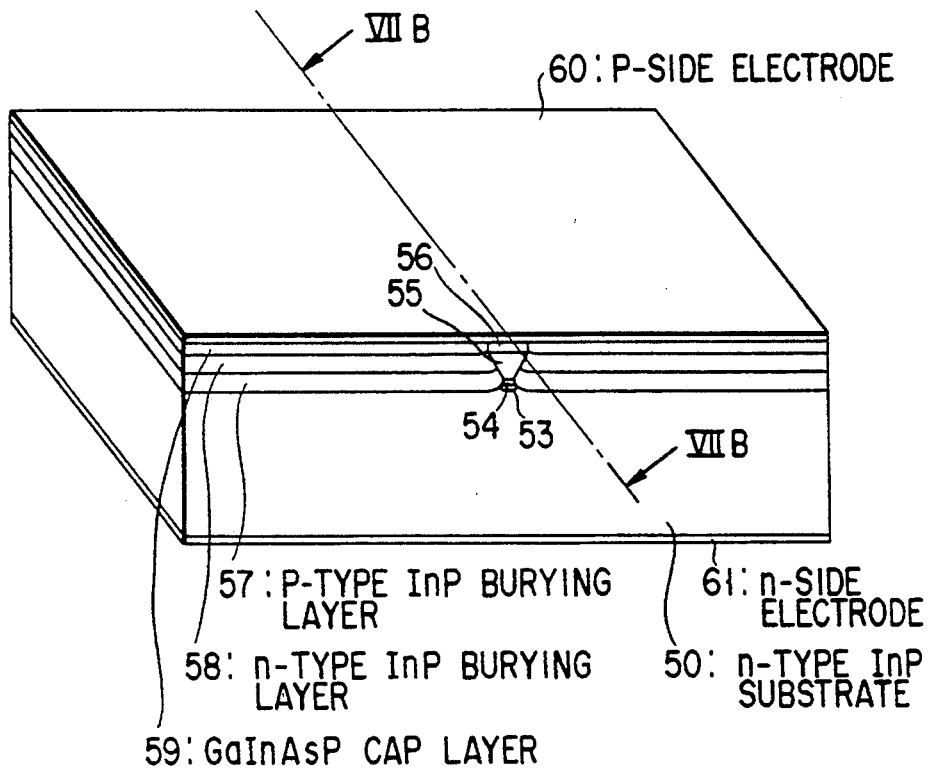
FIG. 7A is a perspective view schematically showing a conventional phase shift DFB semiconductor laser.
Figure 7B:
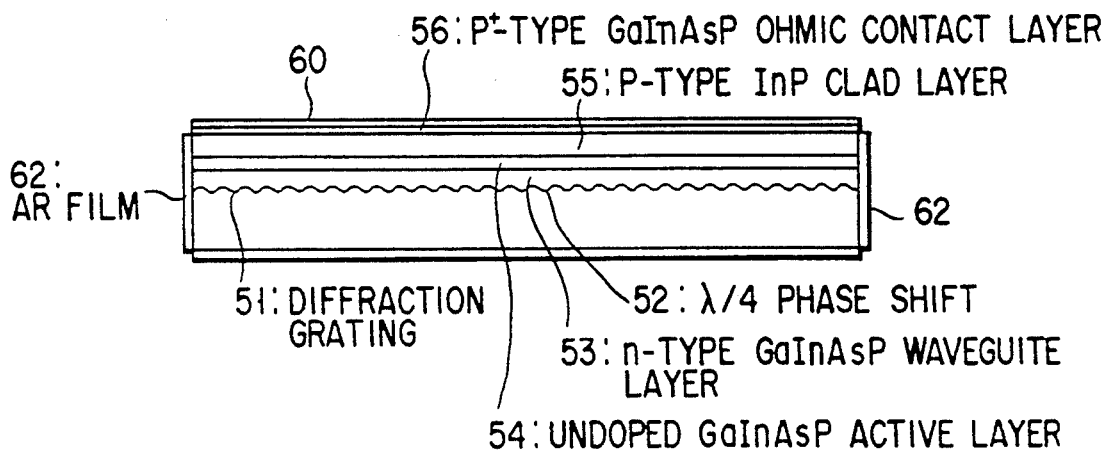
FIG. 7B is a sectional view schematically showing the phase shift DFB semiconductor laser along a line VIIB—VIIB in FIG. 7A.
Figure 8:
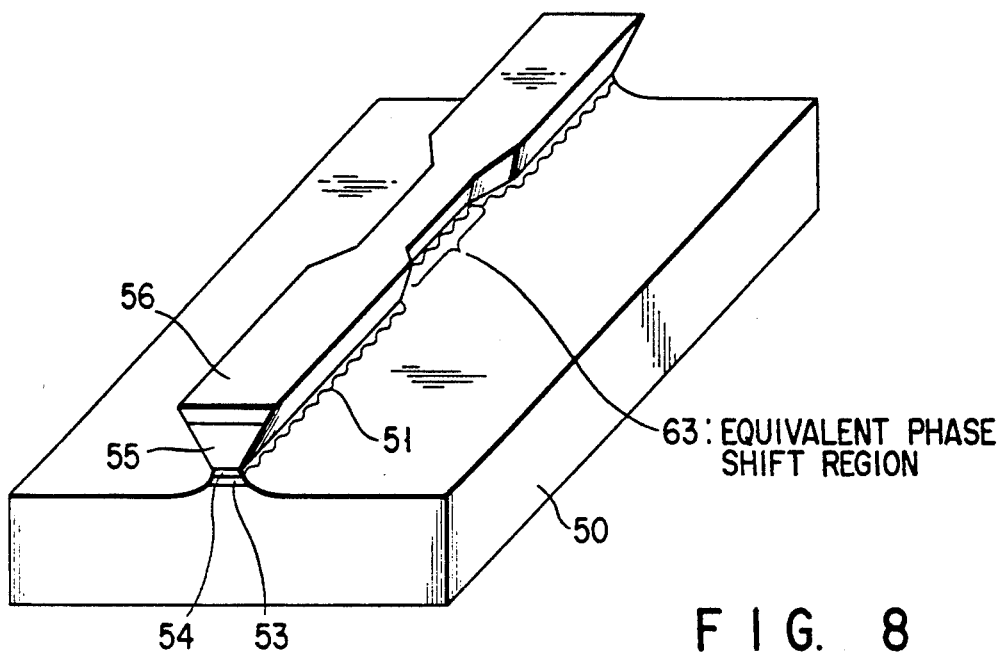
FIG. 8 is a perspective view illustrating a mesa stripe structure of a conventional equivalent phase shift DFB semiconductor laser.
Figure 9A:
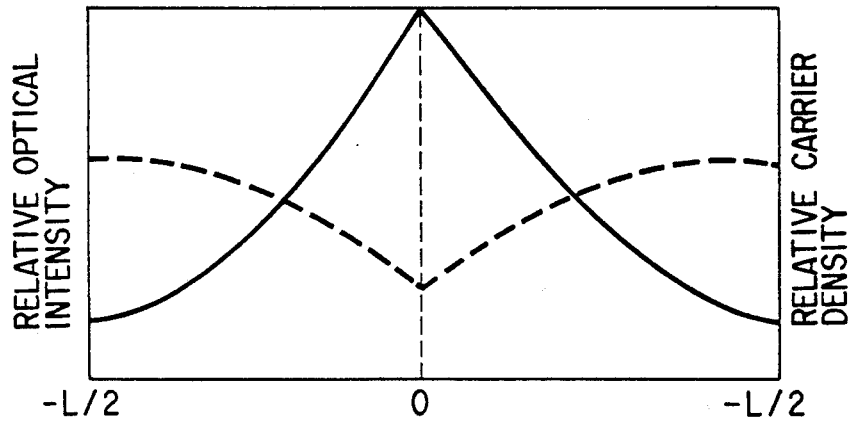
FIGS. 9A and 9B are graphs showing relative optical intensities and relative carrier densities in the axial direction of the semiconductor laser shown in FIGS. 7A and 7B.
Figure 9B:
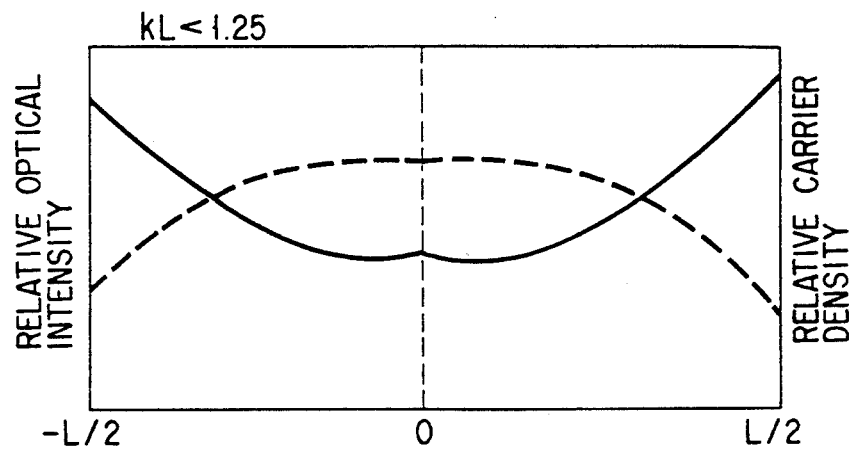

In this case, an I-L characteristic having good linearity can be obtained as indicated by a solid line in FIG. 6. A stable single mode having a small change can be obtained without a kink which is a discontinuous point of the I-L characteristic indicated by a broken line in FIG. 6, in the case where the overall electrode is employed.

Further, when the value κL is smaller than 1.25, the relative density of waveguide light at the central portion of the cavity is reduced to increase the relative carrier density. In this case, wire bonding is carried out such that the current flows through only the five comb-shaped electrodes except for the comb-shaped electrode 21-2a. At this time, when the laser operates, only one of the pair of comb-shaped electrodes is used in the electrode region 2 to increase the resistance therein. On the other hand, since both pairs of comb-shaped electrodes function in the electrode regions 1 and 3, the resistance in the electrode regions 1 and 3 is low. Therefore, the current flowing through the central portion of the cavity, in which the relative carrier density is increased by hole burning, can be decreased to compensate the nonuniformity of the carrier density caused by hole burning.

As described above, since the comb-shaped electrodes may be selected corresponding to the characteristics of the laser, phase shift DFB semiconductor lasers can not be almost affected by the hole burning in any κL value. In addition, according to the degree of the hole burning, the width of each digital stripe can be changed, or the electrode can be divided into three or more.

According to the fourth embodiment, the electrode for injecting the current into the active layer is divided into a plurality of separated comb-shaped electrodes along the cavity axis, and a pair of comb-shaped electrodes are interdigitated with each other. Therefore, by selecting electrodes to be employed, the resistance between the selected electrode and the active layer can be equivalently changed with good controllability, thereby varying the amount of current injection into the active layer. That is, the amount of carrier injection is increased at the portion having the low equivalent resistance. Accordingly, nonuniformity of the carrier density caused by the hole burning can be compensated.

The present invention can be applied to not only the phase shift DFB laser having the GaInAsP/InP buried structure, but to other stripe structures composed of other materials. In addition, the present invention can be applied to not only the phase shift DFB laser, but to a distributed feedback semiconductor laser in which the optical power is concentrated to the facets.

According to the present invention, semiconductor lasers capable of suppressing the hole burning effect to maintain the single longitudinal mode up to the high optical output can be obtained by any structure. In addition, even if the thickness of the active layer is varied in every wafer, the desired amount of phase shift can be easily controlled by changing the thickness of the ohmic contact layer at the central region of the cavity.

Further, the current injection into the active layer can be attained by selecting some of comb-shaped electrodes from the interdigital electrode structure, corresponding to the laser characteristics. Therefore, a complicated control system is not required because the external circuit is not subjected to particular load.

It is further understood by those skilled in the art that the foregoing description is only of the preferred embodiments and that various changes and modifications may be made in the invention without departing from the spirit and scope thereof.

What is claimed is:

1. A distributed feedback semiconductor laser comprising:
   a semiconductor substrate;
   a waveguide, on the semiconductor substrate, including a diffraction grating layer and an active layer;
   an ohmic contact layer on the waveguide;
   a first electrode on the ohmic contact layer;
   a second electrode attached to the semiconductor substrate; and
   means for controlling an electrical resistance between the first electrode and the active layer, along the waveguide, in accordance with a spatial distribution of photon density along the waveguide.

2. The distributed feedback semiconductor laser according to claim 1, wherein the controlling means is configured to substantially provide an effective phase shift region.

3. The distributed feedback semiconductor laser according to claim 1, wherein the waveguide includes a first region configured to have a first photon density and a first electrical resistance, and a second region configured to have a photon density lower than the first photon density and an electrical resistance higher than the first electrical resistance.

4. The distributed feedback semiconductor laser according to claim 3, wherein the first region has a higher impurity level than that of the second region in correspondence with a spatial distribution of photon density.

5. The distributed feedback semiconductor laser according to claim 3, wherein the first region is thinner than the second region in correspondence with a spatial distribution of photon density.

6. A distributed feedback semiconductor laser comprising:
   a semiconductor substrate;
   a waveguide, on the semiconductor substrate, defining a cavity axis and including a diffraction grating layer and an active layer;
   an ohmic contact layer on the waveguide; and
   a plurality of electrode groups attached to the ohmic contact group layer along the cavity axis, each including first divided electrodes and second divided electrodes opposed to the first divided electrodes.

7. The distributed feedback semiconductor laser according to claim 6, wherein the first and second divided electrodes have an inter-digital structure.

8. The distributed feedback semiconductor laser according to claim 6, further including a power supply connected to at least one of the first and second divided electrodes of each electrode group.

9. The distributed feedback semiconductor laser according to claim 8, further including means for controlling an electrical resistance between operating first and second divided electrodes and the active layer.

10. The distributed feedback semiconductor laser according to claim 6, wherein the plurality of electrode groups includes a first group configured to carry a first amount of current, and a second group configured to carry an amount of current less than the first amount.

* * * * *